United States Patent
Tang et al.

(10) Patent No.: US 8,704,319 B2
(45) Date of Patent: Apr. 22, 2014

(54) METHOD AND SYSTEM FOR PROVIDING MAGNETIC LAYERS HAVING INSERTION LAYERS FOR USE IN SPIN TRANSFER TORQUE MEMORIES

(75) Inventors: Xueti Tang, Fremont, CA (US);
Vladimir Nikitin, Campbell, CA (US);
Dmytro Apalkov, San Jose, CA (US);
Kiseok Moon, Pleasanton, CA (US);
Steven M. Watts, Mountain View, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 57 days.

(21) Appl. No.: 13/332,328

(22) Filed: Dec. 20, 2011

(65) Prior Publication Data
US 2012/0261776 A1 Oct. 18, 2012

Related U.S. Application Data

(63) Continuation-in-part of application No. 13/011,849, filed on Jan. 21, 2011, now Pat. No. 8,432,009.

(60) Provisional application No. 61/429,041, filed on Dec. 31, 2010.

(51) Int. Cl.
*H01L 29/82* (2006.01)

(52) U.S. Cl.
USPC ............ 257/421; 257/E21.665; 257/E27.005; 257/E43.004; 257/E29.323; 365/158; 365/145; 369/126; 438/257; 438/3

(58) Field of Classification Search
USPC ........... 360/324; 257/295, 421; 365/173, 158, 365/145; 438/257; 428/811; 369/126
See application file for complete search history.

(56) References Cited

U.S. PATENT DOCUMENTS

| | | | |
|---|---|---|---|
| 2005/0106810 A1* | 5/2005 | Pakala et al. | 438/257 |
| 2006/0291108 A1* | 12/2006 | Sbiaa et al. | 360/324.12 |
| 2008/0230819 A1* | 9/2008 | Nguyen et al. | 257/295 |
| 2009/0251949 A1* | 10/2009 | Xia | 365/158 |
| 2010/0074092 A1* | 3/2010 | Zhu et al. | 369/126 |
| 2010/0080036 A1* | 4/2010 | Liu et al. | 365/145 |

* cited by examiner

*Primary Examiner* — Jerome Jackson, Jr.
*Assistant Examiner* — Bo Fan
(74) *Attorney, Agent, or Firm* — Convergent Law Group LLP

(57) ABSTRACT

A method and system provide a magnetic junction usable in a magnetic device. The magnetic junction includes a pinned layer, a nonmagnetic spacer layer, a free layer, and at least one damping reduction layer. The free layer has an intrinsic damping constant. The nonmagnetic spacer layer is between the pinned layer and the free layer. The at least one damping reduction layer is adjacent to at least a portion of the free layer and configured to reduce the intrinsic damping constant of the free layer. The magnetic junction is configured such that the free layer is switchable between a plurality of stable magnetic states when a write current is passed through the magnetic junction.

33 Claims, 8 Drawing Sheets

METHOD AND SYSTEM FOR PROVIDING MAGNETIC LAYERS HAVING INSERTION LAYERS FOR USE IN SPIN TRANSFER TORQUE MEMORIES

CROSS-REFERENCE TO RELATED APPLICATIONS

This application is a continuation-in-part of U.S. patent application Ser. No. 13/011,849 entitled METHOD AND SYSTEM FOR PROVIDING MAGNETIC LAYERS HAVING INSERTION LAYERS FOR USE IN SPIN TRANSFER TORQUE MEMORIES, which claims the benefit of provisional Patent Application Ser. No. 61/429,041, filed Dec. 31, 2010, assigned to the assignee of the above parent application, and incorporated herein by reference.

GOVERNMENT RIGHTS

This invention was made with U.S. Government support under Grant/Contract No. HR0011-09-C-0023 awarded by DARPA. The U.S. Government retains certain rights in this invention.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-RAM. The conventional MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 24.

Conventional contacts 11 and 24 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator such as MgO.

The conventional pinned layer 16 and the conventional free layer 20 are magnetic. The magnetization 17 of the conventional pinned layer 16 is fixed, or pinned, in a particular direction, typically by an exchange-bias interaction with the AFM layer 14. Although depicted as a simple (single) layer, the conventional pinned layer 16 may include multiple layers. For example, the conventional pinned layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic. Further, other versions of the conventional MTJ 10 might include an additional pinned layer (not shown) separated from the free layer 20 by an additional nonmagnetic barrier or conductive layer (not shown).

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as in-plane, the magnetization 21 of the conventional free layer 20 may have a perpendicular anisotropy. Thus, the pinned layer 16 and free layer 20 may have their magnetizations 17 and 21, respectively oriented perpendicular to the plane of the layers.

To switch the magnetization 21 of the conventional free layer 20, a current is driven perpendicular to plane (in the z-direction). When a sufficient current is driven from the top contact 24 to the bottom contact 11, the magnetization 21 of the conventional free layer 20 may switch to be parallel to the magnetization 17 of the conventional pinned layer 16. When a sufficient current is driven from the bottom contact 11 to the top contact 24, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

When used in STT-RAM applications, the free layer 21 of the conventional MTJ 10 is desired to be switched at a relatively low current. The critical switching current ($I_{c0}$) is the lowest current at which the infinitesimal precession of free layer magnetization 21 around the equilibrium orientation becomes unstable. For example, $I_{c0}$ may be desired to be on the order of a few mA or less. In addition, a short current pulse is desired to be used in programming the conventional magnetic element 10 at higher data rates. For example, current pulses on the order of 20-30 ns or less are desired.

Although the conventional MTJ 10 may be written using spin transfer and used in an STT-RAM, there are drawbacks. For example, the write error rates may be higher than desired for memories having an acceptable $I_{c0}$ and pulse width. The write error rate (WER) is the probability that a cell (i.e. the magnetization 21 of free layer 20 of the conventional magnetic junction) is not switched when subjected to a current that is at least equal to the typical switching current. The WER is desired to be $10^{-9}$ or less. However, the conventional free layer 20 typically has a WER greatly in excess of this value. In addition, it has been determined that the WER may be challenging to improve for shorter write current pulses. For example, FIG. 2 is a graph 50 depicts trends in WERs for pulses of different widths. Note that actual data are not plotted in the graph 50. Instead, the graph 50 is meant to indicate trends. The pulse width, from longest to shortest, is for curves 52, 54, 56, and 58. As can be seen in the graph 50, for higher pulse widths, the WER versus write current has a higher slope. Thus, application of a higher write current for the same pulse width may bring about a significant reduction in the WER. However, as the pulse widths shorten in curves 54, 56, and 58, the slope of the curves 54, 56, and 58 decreases. For a decreasing pulse width, an increase in current is less likely to bring about a reduction in the WER. Consequently, memories employing the conventional MTJ 10 may have unacceptably high WER that may not be cured by an increase in write current.

Various conventional solutions have been proposed to improve characteristics such as the WER. For example, magnetic field assisted switching and/or a magnetic junction having a complex structure may be used. However, the ability of such conventional schemes to reduce the WER while preserving other characteristics is limited. For example, scalability, energy consumption, and/or thermal stability may be adversely affected by such conventional methods.

In addition to the WER, other issues may exist for the conventional MTJ 10. For conventional MTJs 10 having the magnetizations 17 and 21 oriented perpendicular, the magnetoresistance may be lower than a conventional MTJ 10 having its magnetization in-plane. As a result, the signal from the conventional MTJ 10 may be lower than desired. Such perpendicular conventional MTJs 10 also exhibit high damping. As such, switching performance is adversely affected. Thus, performance of a memory using the conventional MTJ 10 is still desired to be improved.

Accordingly, what is needed is a method and system that may improve the performance of the spin transfer torque based memories. The method and system described herein address such a need.

BRIEF SUMMARY OF THE INVENTION

A method and system provide a magnetic junction usable in a magnetic device. The magnetic junction includes a pinned layer, a nonmagnetic spacer layer, a free layer, and at least one damping reduction layer. The free layer has an intrinsic damping constant. The nonmagnetic spacer layer is between the pinned layer and the free layer. The at least one damping reduction layer is adjacent to at least a portion of the free layer and configured to reduce the intrinsic damping constant of the free layer. The magnetic junction is configured such that the free layer is switchable between a plurality of stable magnetic states when a write current is passed through the magnetic junction.

DETAILED DESCRIPTION OF THE INVENTION

Figure 1:
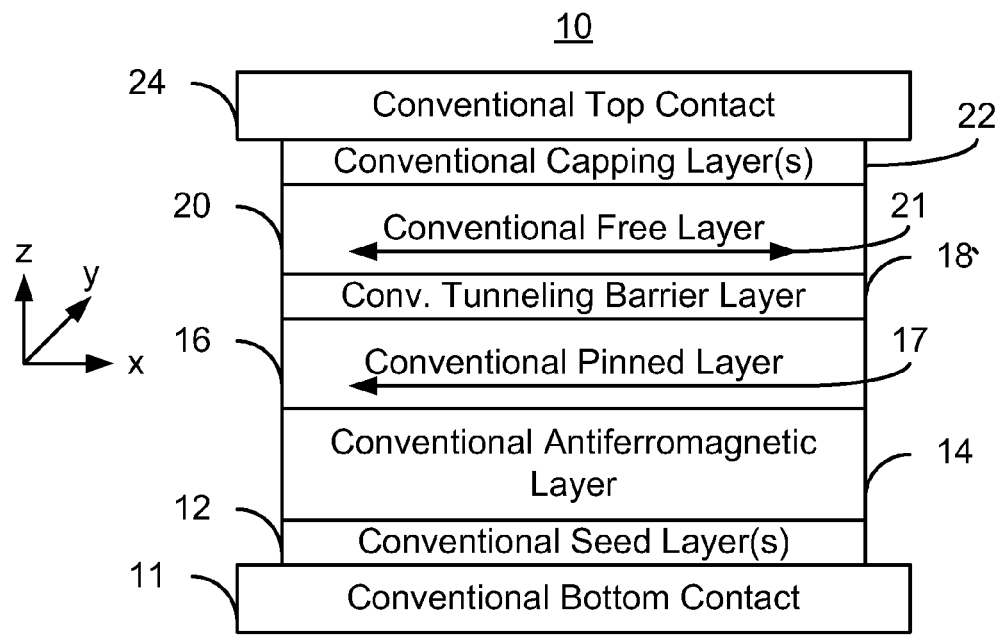
FIG. 1 depicts a conventional magnetic junction.
Figure 2:
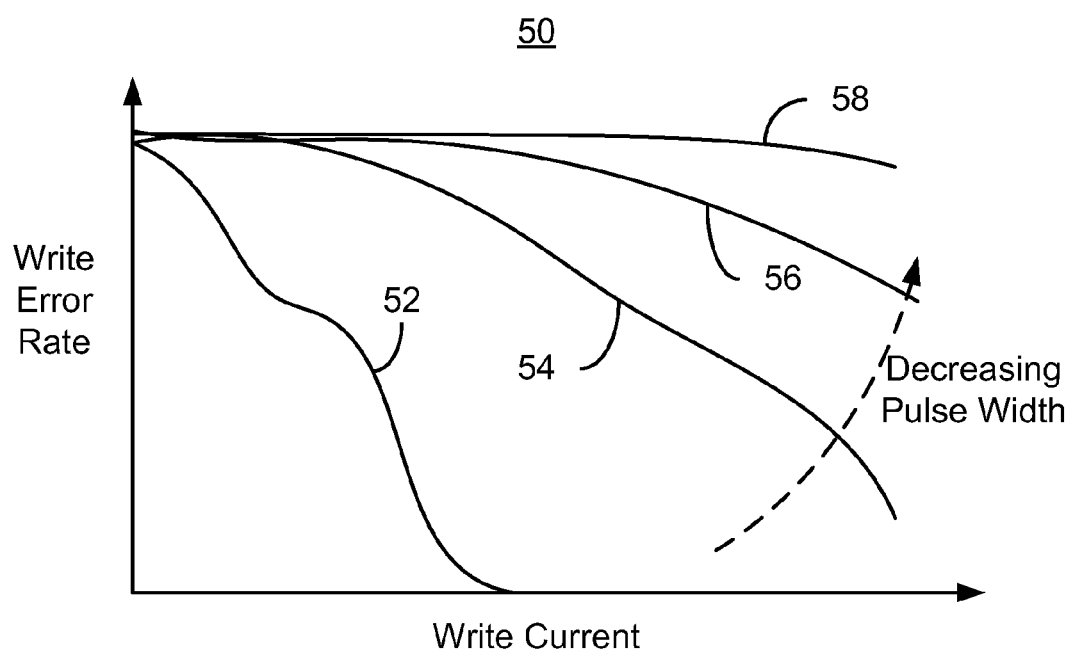
FIG. 2 is a graph depicting trends in write current versus write error rate.

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems for providing a magnetic junction as well as a magnetic memory utilizing the magnetic junction are described. The exemplary embodiments provide methods and systems for providing a magnetic junction usable in a magnetic device. The magnetic junction includes a pinned layer, a nonmagnetic spacer layer, a free layer, and at least one damping reduction layer. The free layer has an intrinsic damping constant. The nonmagnetic spacer layer is between the pinned layer and the free layer. The at least one damping reduction layer is adjacent to at least a portion of the free layer and configured to reduce the intrinsic damping constant of the free layer. The magnetic junction is configured such that the free layer is switchable between a plurality of stable magnetic states when a write current is passed through the magnetic junction.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 3:
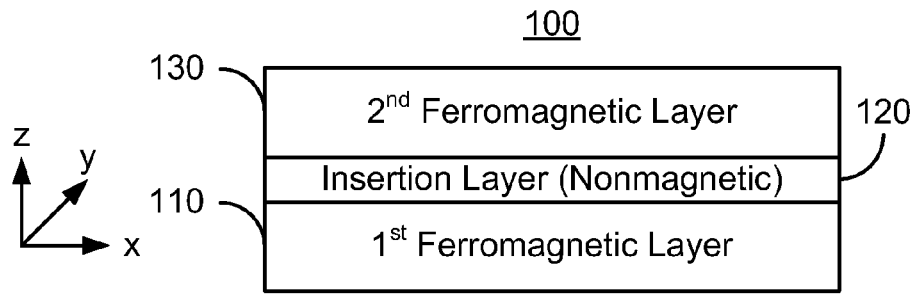
FIG. 3 depicts an exemplary embodiment of a magnetic substructure.

FIG. 3 depicts an exemplary embodiment of a magnetic substructure 100 usable in a magnetic device, for example a magnetic tunneling junction (MTJ), spin valve, or ballistic magnetoresistance structure, or some combination thereof. The magnetic device in which the magnetic substructure 100 is used may be used in a variety of applications. For example, the magnetic device, and thus the magnetic substructure, may be used in a magnetic memory such as an STT-RAM. For clarity, FIG. 3 is not to scale. The magnetic substructure 100 includes a first ferromagnetic layer 110, an insertion layer 120, and a second ferromagnetic layer 130. Although layers 110, 120, and 130 are shown with a particular orientation, this orientation may vary in other embodiments. For example, the ferromagnetic layer 110 may be at the top (furthest from a substrate that is not shown) of the magnetic substructure 100.

The ferromagnetic layers 110 and 130 may include one or more of Ni, Fe, and Co, particularly in an alloy form. In some embodiments, the ferromagnetic layers 110 and 130 include CoFe. In some such embodiments, the ferromagnetic layers 110 and 130 consist of CoFeB. One or both of the ferromagnetic layers 110 and 130 are configured to be stable at room temperature. For example, the magnetic anisotropy energy for the ferromagnetic layers 110 and/or 130 may be at least at least sixty times $k_bT$. In some embodiments, the magnetic anisotropy energies for the ferromagnetic layers 110 and/or 130 are at least eighty times $k_bT$ at room temperature (approximately thirty degrees centigrade). In addition, the layers 110 and 130 are magnetically coupled. In some such embodiments, the layers 110 and 130 are exchange coupled. In some embodiments, this exchange coupling promotes substantially parallel orientations of the magnetizations (not shown in FIG. 3) of the ferromagnetic layers 110 and 130. In other embodiments, the exchange coupling may promote substantially antiparallel or other relative orientation of the magnetizations of the layers 110 and 130. In some of these embodiments, the layer 110 and/or 130 may have a high perpendicular anisotropy. Stated differently, the layer 110 and/or 130 may be weakly in-plane. For example, in some such embodiments, the perpendicular anisotropy energy of the layer 110 and/or 130 may be close to, but less than, the out-of-plane demagnetization energy (approaching $4\pi M_s$ for large cells and less than $4\pi M_s$ for smaller cells due to decreased demagnetization field at the edges). For example, the perpendicular anisotropy energy may be at least forty percent of the out-of-plane demagnetization energy. In some such embodiments, the perpendicular anisotropy energy may be not more than ninety percent of the demagnetization energy. In other embodiments, the magnetizations of the layers 110 and 130 are both perpendicular. In still other embodiments, one or both of the magnetizations of the layers 110 and 130 have components in plane and perpendicular to plane.

The insertion layer 120 is a nonmagnetic layer residing between the ferromagnetic layers 110 and 130. The insertion layer 120 may be conductive. For example, the insertion layer may include materials such as at least one of Cr, Ta, Ti, W, and Ru. In some such embodiments, the insertion layer 120 consists of one of Cr, Ta, Ti, W, and Ru. In other embodiments, the insertion layer 120 may be an insulator such as aluminum oxide and/or MgO. The insertion layer 120 may be used to tailor the magnetic coupling between the layers 110 and 130. The insertion layer 120 may also be used to improve the tunneling magnetoresistance (TMR) of a magnetic tunneling junction, employing the magnetic substructure 100. The coupling between the ferromagnetic layers of the magnetic substructure 100 and the TMR of the magnetic tunneling junction employing the magnetic substructure 100 may be tailored by changing the composition and thickness of the insertion layer 120 as well as the thicknesses and compositions of the ferromagnetic layers 110 and 130.

The properties of the magnetic substructure 100 may be tailored using a combination of the insertion layer 120 and the ferromagnetic layers 110 and 130. As a result, the properties of a magnetic device in which the magnetic substructure 100 is used may also be configured as desired. For example, the TMR of the magnetic device in which the magnetic substructure 100 is used may be enhanced due to improved crystallization of the free layer and lattice match with the tunneling junction, especially for a tunneling junction with two barriers. The switching characteristics, such as the WER and data rate, may be enhanced in a magnetic device in which the magnetic substructure 100 is used.

Figure 4:
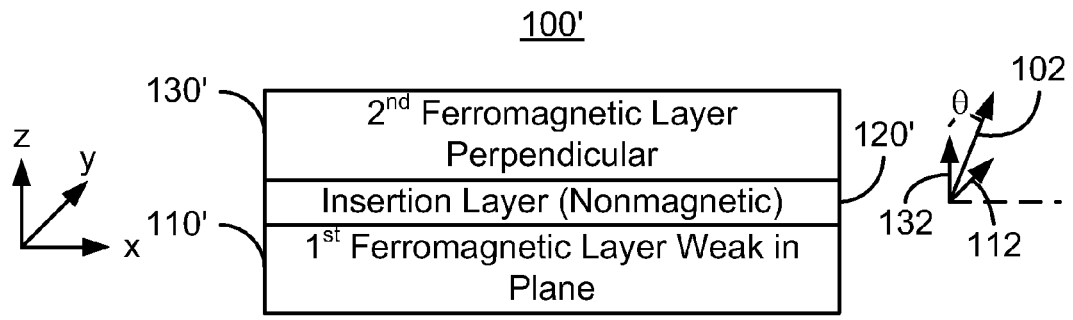
FIG. 4 depicts another exemplary embodiment of a magnetic substructure.

FIG. 4 depicts an exemplary embodiment of a magnetic substructure 100' usable in a magnetic device, for example a MTJ, spin valve, or ballistic magnetoresistance structure, or some combination thereof. The magnetic device in which the magnetic substructure 100' is used may be used in a variety of applications. For example, the magnetic device, and thus the magnetic substructure, may be used in a magnetic memory such as an STT-RAM. For clarity, FIG. 4 is not to scale. The magnetic substructure 100' is analogous to the magnetic substructure 100. Consequently, analogous components are labeled similarly. The magnetic substructure 100' thus includes a first ferromagnetic layer 110', an insertion layer 120', and a second ferromagnetic layer 130' that are analogous to the first ferromagnetic layer 110, the insertion layer 120, and the second ferromagnetic layer 130. Although layers 110', 120', and 130' are shown with a particular orientation, this orientation may vary in other embodiments. For example, the ferromagnetic layer 110' may be at the top (furthest from a substrate that is not shown) of the magnetic substructure 100'.

The magnetic substructure 100' is configured such that the ferromagnetic layer 110' has a weak in-plane anisotropy. Thus, the perpendicular anisotropy energy of the layer 110' may be close to, but less than, the out-of-plane demagnetization energy. For example, the perpendicular anisotropy energy may be at least forty percent of the out-of-plane demagnetization energy for the layer 110'. In some such embodiments, the perpendicular anisotropy energy may be not more than ninety percent of the demagnetization energy. Thus, without the interaction with the layer 130', the magnetization of the ferromagnetic layer 110 is in plane. In contrast, the layer 130' has a high perpendicular anisotropy. Thus, the perpendicular anisotropy energy is greater than the out-of-plane demagnetization energy. In some embodiments, the perpendicular anisotropy energy is significantly greater than the out-of-plane demagnetization energy. For example, in some embodiments, the perpendicular anisotropy energy may be two through four kilooersted (or more) greater than the out-of-plane demagnetization energy.

The ferromagnetic layers 110' and 130' may include one or more of Ni, Fe, and Co, particularly in an alloy form. In some embodiments, the ferromagnetic layers 110' and 130' include CoFe in some form, such as CoFeB. For example, in some embodiments, the ferromagnetic layers 110' and/or 130' could include alloys such CoFeB, CoPd, CoPt, FePt, as simple layers and/or mulitilayers such as Co/Pd, Co/Pt, Fe/Pt, Co/Ru. At least one of the ferromagnetic layers 110' and 130' is configured to be stable at room temperature. For example, the magnetic anisotropy energy for one or both of the ferromagnetic layers 110' and/or 130' may be at least at least sixty times $k_bT$. In some embodiments, the magnetic anisotropy energies for one or both of the ferromagnetic layers 110' and/or 130' are at least eighty times $k_bT$ at room temperature (approximately thirty degrees centigrade).

The ferromagnetic layers 110' and 130' are magnetically coupled. In some such embodiments, the layers 110' and 130' are exchange coupled. The net result of the magnetizations are also shown in FIG. 4. The magnetization 112 of the ferromagnetic layer 110', the magnetization 132 of the ferromagnetic layer 132 and the net magnetization 102 of the structure 100' are shown. As can be seen in FIG. 4, the magnetization 112 is not in-plane. This is because of the magnetic coupling between the layers 110' and 130'. The high perpendicular anisotropy energy layer 130' is magnetically coupled with the weakly in-plane layer 110', causing the magnetization 112 of the layer 110' to be out-of-plane. Thus, the magnetization 112 has components in-plane and perpendicular-to-plane. As a result, the net moment of the magnetic structure 100' has components in plane and perpendicular-to-plane. Because of the exchange interaction between the layers 110' and 130', the magnetization 102 of the magnetic substructure 100' is at an angle θ from the z-axis (normal to the plane of the magnetic substructure 100'). The net result is that the magnetization 102 of the magnetic substructure 100' is stable in an angle from the z-axis. Consequently, improved switching characteristics, thermal stability, and scalability may be achieved.

This initial nonzero angle allows the magnetization of the magnetic substructure 100' to be more easily switched by a spin transfer torque. For example, the magnetic substructure 100' may be used in an MTJ. This characteristic corresponds to a lower write error rate for such a magnetic element. The lower WER may be achieved even at low pulse widths (high data rates). In particular, the slope of the write error rate versus write current may remain sufficiently large even for pulse widths of less than ten ns. In some embodiments, an acceptable write error rate of $10^{-9}$ or less may be achieved for pulse widths of 10-30 ns or less. Thus, instead of assisting switching using a mechanism such as an external field, the physical cause of the high error rates is addressed. Consequently, when used in a magnetic element, such as an MTJ, the magnetic substructure 100' may have an improved write error rate even for lower pulse widths.

Figure 5:
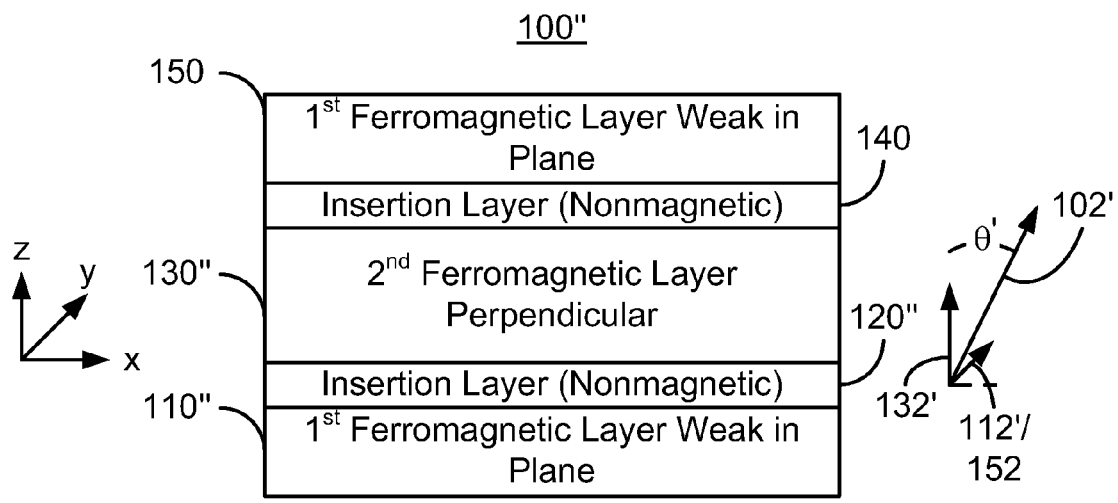
FIG. 5 depicts another exemplary embodiment of a magnetic substructure.

FIG. 5 depicts an exemplary embodiment of a magnetic substructure 100" usable in a magnetic device, for example a MTJ, spin valve, or ballistic magnetoresistance structure, or some combination thereof. The magnetic device in which the magnetic substructure 100" is used may be used in a variety of applications. For example, the magnetic device, and thus the magnetic substructure, may be used in a magnetic memory such as an STT-RAM. For clarity, FIG. 5 is not to scale. The magnetic substructure 100" is analogous to the magnetic substructures 100 and 100'. Consequently, analogous components are labeled similarly. The magnetic substructure 100" thus includes a first ferromagnetic layer 110", an insertion layer 120", and a second ferromagnetic layer 130" that are analogous to the first ferromagnetic layer 110/110', the insertion layer 120/120', and the second ferromagnetic layer 130/130'. Although layers 110", 120", and 130" are shown with a particular orientation, this orientation may vary in other embodiments. For example, the ferromagnetic layer 110" may be at the top (furthest from a substrate that is not shown) of the magnetic substructure 100".

The magnetic substructure 100" also includes an additional insertion layer 140 and another ferromagnetic layer 150. In the embodiment shown, the layers 110" and 150 have a weak in-plane anisotropy. Thus, without more, the magnetizations of the ferromagnetic layers 110" and 150 are in plane. The layer 130" is strongly perpendicular. In some embodiments, the layer 130" is thicker than the layers 110" and 150. For example, the layer 130" may have a thickness equal to the sum of the thicknesses of the layers 110" and 150. The layers 110", 130" and 150 are magnetically coupled. In some embodiments, the layers 110", 130", and 150 are exchange coupled. Further, the layer 130" is magnetically stable at room temperature. In some embodiments, the magnetic anisotropy energy for the ferromagnetic layer 130" are at least sixty times $k_bT$ at room temperature. In some such embodiments, the magnetic anisotropy energies for the ferromagnetic layer 130" is at least eighty times $k_bT$ at room temperature.

FIG. 5 also depicts the magnetizations 112', 132' and 152 of the layers 110", 130", and 150, respectively. Further, the net magnetization 102' of the magnetic substructure 100" is shown. The magnetizations 112' and 152 are shown as being the same. However, in other embodiments, the magnetizations 112' and 152 may differ. As can be seen in FIG. 5, the magnetizations 112' and 152 are not in-plane. This is because of the magnetic coupling between the layers 110"/150 and 130". As a result, the net moment 102' of the magnetic structure 100" has components in plane and perpendicular-to-plane. Because of the exchange interaction between the layers 110"/150 and 130", the magnetization 102' of the magnetic substructure 100' is at an angle 8' from the z-axis (normal to the plane of the magnetic substructure 100"). The net result is that the magnetization 102 of the magnetic substructure 100" is stable at an angle from the z-axis. Consequently, improved switching characteristics, thermal stability, and scalability may be achieved.

The magnetic substructure 100" shares the benefits of the magnetic substructure 100'. In particular, when used in a magnetic element, such as an MTJ, the MTJ may have a lower WER. Consequently, when used in a magnetic element, such as an MTJ, the magnetic substructure 100" may have an improved write error rate even for lower pulse widths. At the same time, the magnetic substructure 100" may be magnetically stable.

Figure 6:
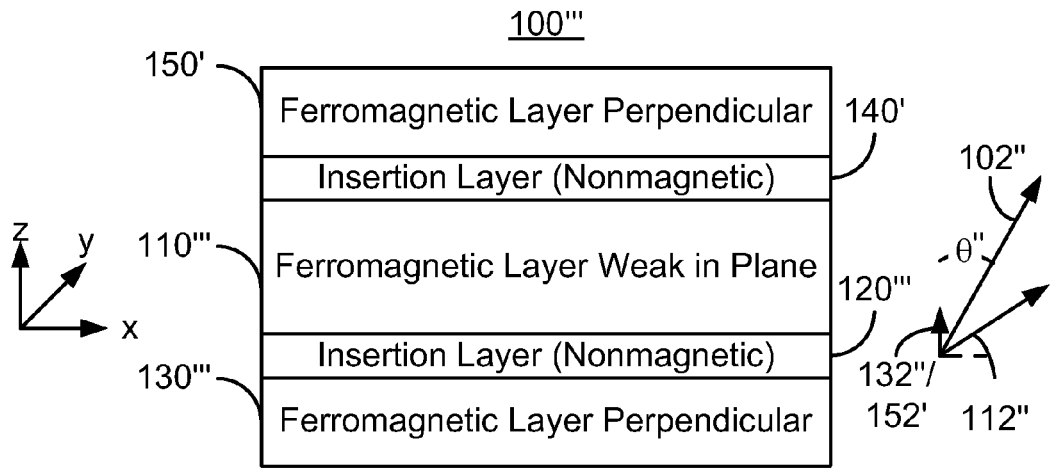
FIG. 6 depicts another exemplary embodiment of a magnetic substructure.

FIG. 6 depicts an exemplary embodiment of a magnetic substructure 100''' usable in a magnetic device, for example a MTJ, spin valve, or ballistic magnetoresistance structure, or some combination thereof. The magnetic device in which the magnetic substructure 100''' is used may be used in a variety of applications. For example, the magnetic device, and thus the magnetic substructure, may be used in a magnetic memory such as an STT-RAM. For clarity, FIG. 6 is not to scale. The magnetic substructure 100''' is analogous to the magnetic substructures 100, 100', and 100". Consequently, analogous components are labeled similarly. The magnetic substructure 100''' thus includes a first ferromagnetic layer 110''', an insertion layer 120''', a second ferromagnetic layer 130''', an additional insertion layer 140' and an additional ferromagnetic layer 150' that are analogous to the first ferromagnetic layer 110/110'/110", the insertion layer 120/120'/120", the second ferromagnetic layer 130/130'/130", the additional insertion layer 140, and the additional ferromagnetic layer 150. Although layers 110", 120", 130", 140', and 150' are shown with a particular orientation, this orientation may vary in other embodiments. For example, the ferromagnetic layer 130''' may be at the top (furthest from a substrate that is not shown) of the magnetic substructure 100'''.

In the magnetic substructure 100''', the weakly in-plane layer 110''' is between the perpendicular layers 130" and 150'. Without more, the magnetization of the ferromagnetic layer 110" is in plane. In some embodiments, the layer 110''' is thicker than the layers 130''' and 150'. For example, the layer 110''' may have a thickness equal to the sum of the thicknesses of the layers 130''' and 150'. The layers 110''', 130''' and 150' are magnetically coupled. In some embodiments, the layers 110''', 130''', and 150' are exchange coupled. Further, the layers 130''' and 150' are magnetically stable at room temperature. In some embodiments, the magnetic anisotropy energies for the ferromagnetic layers 130''', and/or 150' are at least sixty times $k_b T$ at room temperature. In other embodiments, the magnetic anisotropy energies for the ferromagnetic layers 110''', 130''', and/or 150' are at least eighty times $k_b T$ at room temperature.

FIG. 6 also depicts the magnetizations 112", 132" and 152' of the layers 110''', 130''', and 150', respectively. Further, the net magnetization 102" of the magnetic substructure 100''' is shown. The magnetizations 132" and 152' are shown as being the same. However, in other embodiments, the magnetizations 132" and 152' may differ. As can be seen in FIG. 6, the magnetization 112" is not in-plane. This is because of the magnetic coupling between the layers 110''' and 130'''/150'. As a result, the net moment 102" of the magnetic structure 100''' has components in plane and perpendicular-to-plane. Because of the exchange interaction between the layers 110''' and 130'''/150', the magnetization 102" of the magnetic substructure 100''' is at an angle 8" from the z-axis (normal to the plane of the magnetic substructure 100'''). The net result is that the magnetization 102" of the magnetic substructure 100''' is stable at an angle from the z-axis. Consequently, improved switching characteristics, thermal stability, and scalability may be achieved.

The magnetic substructure 100''' shares the benefits of the magnetic substructure 100'. In particular, when used in a magnetic element, such as an MTJ, the MTJ may have a lower WER. Consequently, when used in a magnetic element, such as an MTJ, the magnetic substructure 100''' may have an improved write error rate even for lower pulse widths. At the same time, the magnetic substructure 100''' may be magnetically stable.

The magnetic substructures 100, 100', 100", and/or 100''' may be inserted into various layers in a magnetic junction. For example, the magnetic substructures may be used in one or more of the free layer and pinned layers of a magnetic junction. As a result, the magnetic junction may enjoy the benefits of the magnetic substructures 100, 100', 100", and/or 100'''. For example, the magnetic junction employing the magnetic substructures 100, 100', 100", and/or 100''' may be thermally stable. Further, the net magnetic magnetization of a free layer using the magnetic substructures 100, 100', 100", and/or 100''' may be at an angle from the z axis that is less than ninety degrees, but greater than zero degrees. Stated differently, the net magnetization of the free layer is canted from the z-axis. Thus, the free layer may be easier to switch using spin transfer torque. Further, the WER of the magnetic junction may be reduced. Other layers, such as the pinned layer(s) of a magnetic junction may include the magnetic substructures 100, 100', 100", and/or 100'''.

Although the magnetic substructures 100, 100', 100", and/or 100''' may enhance various characteristics of a magnetic junction, other drawbacks may still exist. For example, the magnetic materials used have a characteristic damping constant, $\alpha$. This required switching current density for spin transfer torque is proportional to this damping constant. Thus, it is desirable for the damping constant to be low. However, many materials, including those having a higher perpendicular anisotropy, tend to have a higher damping constant. A high perpendicular anisotropy is a perpendicular anisotropy that is greater than the out-of-plane demagnetization field ($4\pi M_s$). As a result, a high perpendicular anisotropy layer may have its magnetic moment perpendicular to the plane of the layer. For example, a CoFeB/MgO bilayer has a high perpendicular anisotropy, but a high damping constant on the order of 0.01. FePd and FePt have even higher damping constants, on the order of 0.03 and 0.05, respectively. Thus, magnetic junctions formed using such magnetic materials may have a higher switching current that is desired. Accordingly, a mechanism for reducing the damping constant, particularly for high perpendicular anisotropy materials, is desired.

Figure 7:
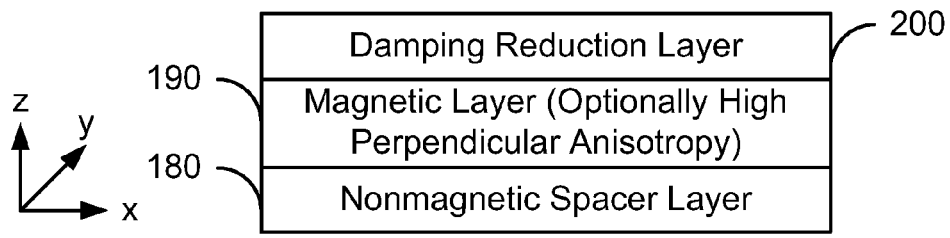
FIG. 7 depicts an exemplary embodiment of a damping reduction layer.

FIG. 7 depicts one embodiment of a damping reduction layer 200. The damping reduction layer 200 is shown as used in connection with a magnetic layer 190 and a nonmagnetic layer 180. The magnetic layer 190 may be analogous to a free layer, a pinned layer, and/or a magnetic layer within the free layer and/or pinned layer. In some embodiments, the magnetic layer 190 may have its magnetization in plane (in the x-y plane). In other embodiments, the magnetic layer 190 may have a perpendicular anisotropy energy that is greater than the out-of-plane demagnetization energy. Thus, the magnetic layer may have its magnetization perpendicular to plane (e.g. parallel to the z-axis). Further, the magnetic layer 190 may be a multilayer. Similarly, the nonmagnetic layer 180 may be analogous to a nonmagnetic spacer layer in a magnetic junction. For example, the nonmagnetic layer 180 may be a tunneling barrier layer, such as crystalline MgO. In other embodiments, the nonmagnetic layer may be a nonmagnetic seed layer, such as MgO or another material. Although shown on top of the magnetic layer 190, the damping reduction layer 200 may reside under the magnetic layer. Thus, in the embodiment shown the magnetic layer 190 is between the damping reduction layer 200 and a substrate (not shown). However, in other embodiments, the magnetic layer 200 may reside on the damping reduction layer 200. Thus, the damping reduction layer 200 may be fabricated first and reside between the magnetic layer 190 and the substrate (not shown). Further, in other embodiments, multiple damping reduction layers 200 may be used. For example, two damping reduction layers may sandwich the magnetic layer 190.

The magnetic layer 190 has an intrinsic damping constant, $\alpha_i$. The constant $\alpha$ is the phenomenological Gilbert's damping constant. The damping constant $\alpha_i$. is the damping constant that the magnetic layer 190 would have in the absence of the damping reduction layer 200. The damping reduction layer 200 is configured to reduce the damping of the magnetic layer 190. More specifically, the damping reduction layer 200 reduces the damping for the magnetic layer 190 such that a damping constant, $\alpha$, of the magnetic layer 190 as used with the damping reduction layer is less than intrinsic damping constant, $\alpha_i$, of the magnetic layer 190 in the absence of the damping reduction layer 200.

The damping reduction layer 200 is an insulator and, in some embodiments, is an oxide. For example, the damping reduction layer 200 may include one or more of tantalum oxide, magnesium oxide, iron oxide, cobalt oxide, cobalt-iron oxide, ruthenium oxide. In embodiments in which the damping reduction layer 200 is formed on the magnetic layer 190, the damping reduction layer 200 may be formed by naturally oxidizing the magnetic layer 190. In other embodiments, the damping reduction layer may be deposited. For example, an oxide may be deposited or a metal deposited then oxidized.

Although it is an oxide, the damping reduction layer 200 is configured to allow current carriers through the damping reduction layer. For example, the damping reduction layer 200 may be sufficiently thin that it is a tunneling barrier layer. In other embodiments, the damping reduction layer 200 may be discontinuous. Thus, current may pass through some combination of regions where the damping reduction layer 200 is sufficiently thin to allow conduction and regions where the damping reduction layer 200 has apertures. In still other embodiments, the damping reduction layer 200 may be a composite layer that includes conductive channels in an insulating matrix. In such an embodiment, the conductive channels need not extend through the damping reduction layer 200. However, the location, proximity, and geometry of the channels are such that the damping reduction layer 200 can conduct current carriers through the combination of the channels and insulating matrix.

The damping conduction layer 200 results in the magnetic layer 190 having a lower damping constant, $\alpha$, for spin transfer torque. In other words a for the magnetic layer 190 may be reduced below the intrinsic $\alpha_i$. The mechanism by which the reduction in the damping constant may be a reduction in spin pumping for the layer 190. A reduction in damping due to spin pumping is described below. However, the damping reduction layer 200 may operate in another manner. Thus, although operation of the damping reduction layer 200 is described in the context of spin pumping, nothing prevents the damping reduction layer 200 from operating in another manner including a combination of spin pumping and other effect(s).

Spin pumping generates a spin polarized current that would exit the magnetic layer 190. The damping reduction layer 200 may act to reduce the flow of spin polarized current carriers (e.g. electrons) due to spin pumping from the magnetic layer 190. In particular, the damping reduction layer 200 may allow for scattering of current carriers while preserving at least some of the scattered current carriers' spin information. In some embodiments, the damping reduction layer 200 preserves spin information of a majority of the current carriers scattering in the damping reduction layer 200. In some such embodiments, the damping reduction layer 200 preserves spin information of substantially all of the current carriers scattering in the damping reduction layer 200. At least some of these scattered current carriers would return to the magnetic layer 190 with their spin information intact. Thus, the spin polarized current of scattered current carriers would return from the damping reduction layer 200 to the magnetic layer 190. Thus, the spin pumping for the magnetic layer 190 would effectively be reduced. As a result, the damping (and thus $\alpha$) of the magnetic layer 190 is reduced. A reduction in the damping of the magnetic layer 190 allows the magnetic layer 190 to be switched due to spin transfer torque at a lower critical current. Thus, the damping reduction layer 200 may improve operation of the magnetic layer 190 when used, for example, as a free layer in a magnetic junction.

Figure 8:
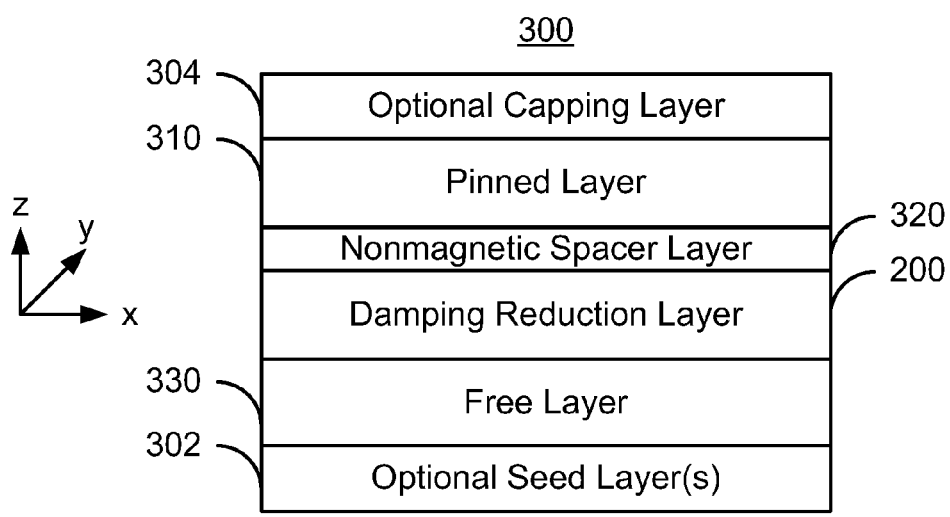
FIG. 8 depicts an exemplary embodiment of a magnetic junction including a damping reduction layer.

FIG. 8 depicts an exemplary embodiment of a magnetic junction 300 including a damping reduction layer such as the damping reduction layer 200. For clarity, FIG. 8 is not to scale. The magnetic junction 300 includes optional seed layer 302, a pinned layer 310, a nonmagnetic spacer layer 320, a free layer 330, and optional capping layer 304. Although layers 310, 320, and 330 are shown with a particular orientation, this orientation may vary in other embodiments. For example, the free layer 330 may be closer to the top (furthest from a substrate that is not shown) of the magnetic junction 300. An optional pinning layer (not shown) may adjoin the pinned layer 310 if, for example, the magnetic moment is in plane. The optional pinning layer may be used to fix the magnetization (not shown) of the pinned layer 310. In some embodiments, the optional pinning layer may be an AFM layer or multilayer that pins the magnetization (not shown) of the pinned layer 310 by an exchange-bias interaction. The magnetic junction 300 is also configured to allow the free layer 330 to be switched between stable magnetic states when a write current is passed through the magnetic junction 300. Thus, the free layer 330 is switchable utilizing spin transfer torque.

Although depicted as simple layers, the pinned layer 310 and/or the free layer 330 may include multiple layers. For example, the pinned layer 310 and/or the free layer 330 may be a SAF including magnetic layers antiferromagnetically or ferromagnetically coupled through thin layers, such as Ru. In such a SAF, multiple magnetic layers interleaved with thin layer(s) of Ru or other material may be used. The pinned layer 310 may also be another multilayer. Although a magnetization is not depicted in FIG. 8, the pinned layer 310 and/or the free layer 330 may have a perpendicular anisotropy energy that exceeds the out-of-plane demagnetization energy. Thus, the pinned layer 310 and/or the free layer 330 may have its magnetic moment oriented perpendicular to plane. In other embodiments, the magnetic moment of the pinned layer 310 and/or the free layer 330 is in-plane. Other orientations of the magnetization of the pinned layer 310 and/or the free layer 330 are possible. In some embodiments, the pinned layer 310 and/or the free layer 330 may include the magnetic substructure 100, 100', 100'', and/or 100'''.

The spacer layer 320 is nonmagnetic. In some embodiments, the spacer layer 320 is an insulator, for example a tunneling barrier. In such embodiments, the spacer layer 320 may include crystalline MgO, which may enhance the TMR of the magnetic junction. The seed layer 302 and/or capping layer 304 may also include an insulator such as MgO. Such material(s) may be used in order to enhance the TMR if crystalline MgO is used in for the nonmagnetic spacer layer 320. In other embodiments, the spacer layer 320 may be a conductor, such as Cu. In alternate embodiments, the spacer layer 320 might have another structure, for example a granular layer including conductive channels in an insulating matrix.

The damping reduction layer 200 adjoins the free layer 330 in the embodiment shown in FIG. 8. Stated differently, the damping reduction layer 200 and the free layer 330 share an interface. The damping reduction layer 200 also resides between the free layer 330 and the nonmagnetic spacer layer 320. The free layer 330 is also closer to the seed layer 302 than the pinned layer 310. The damping reduction layer 200 reduces the damping coefficient, α, of the free layer 330 below its intrinsic value. Thus, the damping of the free layer 330 is reduced. As a result, the free layer 330 may be written using spin transfer torque at a lower switching current density. Further, use of the magnetic substructure 100, 100', 100", and/or 100''' may further improve performance of the magnetic junction 300. Consequently, performance of the magnetic junction 300 may be enhanced.

Figure 9:
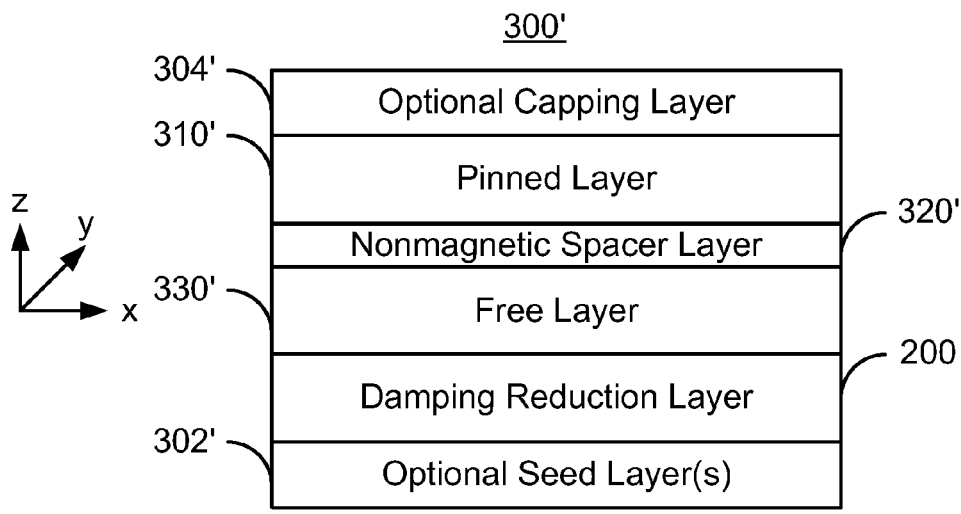
FIG. 9 depicts another exemplary embodiment of a magnetic junction including a damping reduction layer.

FIG. 9 depicts an exemplary embodiment of a magnetic junction 300' including magnetic substructure. For clarity, FIG. 9 is not to scale. The magnetic junction 300' is analogous to the magnetic junction 300. Thus, analogous layers are labeled similarly. The magnetic junction 300' includes a pinned layer 310', a nonmagnetic spacer layer 320', and a free layer 330' analogous to the layers 310, 320, and 330, respectively. Although layers 310', 320', and 330' are shown with a particular orientation, this orientation may vary in other embodiments. For example, the free layer 330' may be closer to the top (furthest from a substrate that is not shown) of the magnetic junction 300'. Also shown are optional seed layer 302' and optional capping layer 304' analogous to the optional seed layer 302 and optional capping layer 304. An optional pinning layer (not shown) might also be used. The magnetic junction 300' is also configured to allow the free layer 330' to be switched between stable magnetic states when a write current is passed through the magnetic junction 300'. Thus, the free layer 330' is switchable utilizing spin transfer torque.

The spacer layer 320' is nonmagnetic. In some embodiments, the spacer layer 320' is an insulator, for example a tunneling barrier. In such embodiments, the spacer layer 320' may include crystalline MgO, which may enhance the TMR of the magnetic junction. In other embodiments, the spacer layer may be a conductor, such as Cu. In alternate embodiments, the spacer layer 320' might have another structure, for example a granular layer including conductive channels in an insulating matrix.

The pinned layer 310' and/or the free layer 330' may be a simple layer or may include multiple layers. For example, the pinned layer 310' and/or the free layer 330' may be a SAF including magnetic layers antiferromagnetically or ferromagnetically coupled through thin layers, such as Ru. In such a SAF, multiple magnetic layers interleaved with thin layer(s) of Ru or other material may be used. The pinned layer 310' and/or the free layer 330' may also be another multilayer. Although a magnetization is not depicted in FIG. 9, the pinned layer 310' and/or the free layer 330' may have a perpendicular anisotropy energy that exceeds the out-of-plane demagnetization energy.

The damping reduction layer 200 adjoins the free layer 330' in the embodiment shown in FIG. 9. Stated differently, the damping reduction layer 200 and the free layer 330' share an interface. However, in the embodiment shown in FIG. 9, the free layer 330' is between the damping reduction layer 200 and the nonmagnetic spacer layer 320'. The free layer 330' is also closer to the seed layer 302' than the pinned layer 310'. The damping reduction layer 200 reduces the damping coefficient, α, of the free layer 330' below its intrinsic value. Thus, the damping of the free layer 330' is reduced. As a result, the free layer 330' may be written using spin transfer torque at a lower switching current density. Further, use of the magnetic substructure 100, 100', 100", and/or 100''' may further improve performance of the magnetic junction 300'. Consequently, performance of the magnetic junction 300' may be enhanced.

Figure 10:
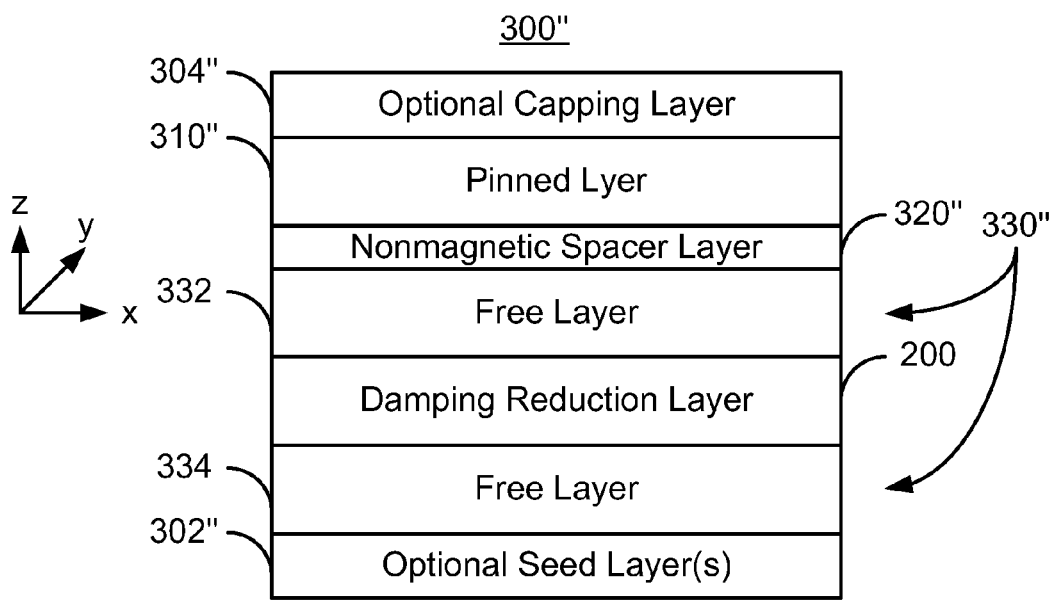
FIG. 10 depicts another exemplary embodiment of a magnetic junction including a damping reduction layer.

FIG. 10 depicts an exemplary embodiment of a magnetic junction 300" including magnetic substructure. For clarity, FIG. 10 is not to scale. The magnetic junction 300" is analogous to the magnetic junction 300 and/or 300'. Thus, analogous layers are labeled similarly. The magnetic junction 300" includes a pinned layer 310", a nonmagnetic spacer layer 320", and a free layer 330" analogous to the layers 310/310', 320/320', and 330/330', respectively. Although layers 310", 320", and 330" are shown with a particular orientation, this orientation may vary in other embodiments. For example, the free layer 330" may be closer to the top (furthest from a substrate that is not shown) of the magnetic junction 300". Also shown are optional seed layer 302" and optional capping layer 304" analogous to the optional seed layer 302/302' and optional capping layer 304/304'. An optional pinning layer (not shown) might also be used. The magnetic junction 300" is also configured to allow the free layer 330" to be switched between stable magnetic states when a write current is passed through the magnetic junction 300". Thus, the free layer 330" is switchable utilizing spin transfer torque.

The spacer layer 320" is nonmagnetic. In some embodiments, the spacer layer 320" is an insulator, for example a tunneling barrier. In such embodiments, the spacer layer 320" may include crystalline MgO, which may enhance the TMR of the magnetic junction. In other embodiments, the spacer layer may be a conductor, such as Cu. In alternate embodiments, the spacer layer 320" might have another structure, for example a granular layer including conductive channels in an insulating matrix.

The pinned layer 310" and/or the free layer 330" may be a simple layer or may include multiple layers. For example, the pinned layer 310" and/or the free layer 330" may be a SAF including magnetic layers antiferromagnetically or ferromagnetically coupled through thin layers, such as Ru. In such a SAF, multiple magnetic layers interleaved with thin layer(s) of Ru or other material may be used. The pinned layer 310" and/or the free layer 330" may also be another multilayer. Although a magnetization is not depicted in FIG. 10, the pinned layer 310" and/or the free layer 330" may have a perpendicular anisotropy energy that exceeds the out-of-plane demagnetization energy. The free layer 330" is also closer to the seed layer 302" than the pinned layer 310".

The damping reduction layer 200 not only adjoins portions of the free layer 330" in the embodiment shown in FIG. 10, but also lies within the free layer 330". Thus, the free layer 330" includes to sublayers 332 and 334 between which is the damping reduction layer 200. The damping reduction layer 200 reduces the damping coefficient, α, of the free layer 330" below its intrinsic value. Thus, the damping of the free layer 330" is reduced. As a result, the free layer 330" may be written using spin transfer torque at a lower switching current density. Further, use of the magnetic substructure 100, 100', 100", and/or 100''' may further improve performance of the magnetic junction 300". Consequently, performance of the magnetic junction 300" may be enhanced.

Figure 11:
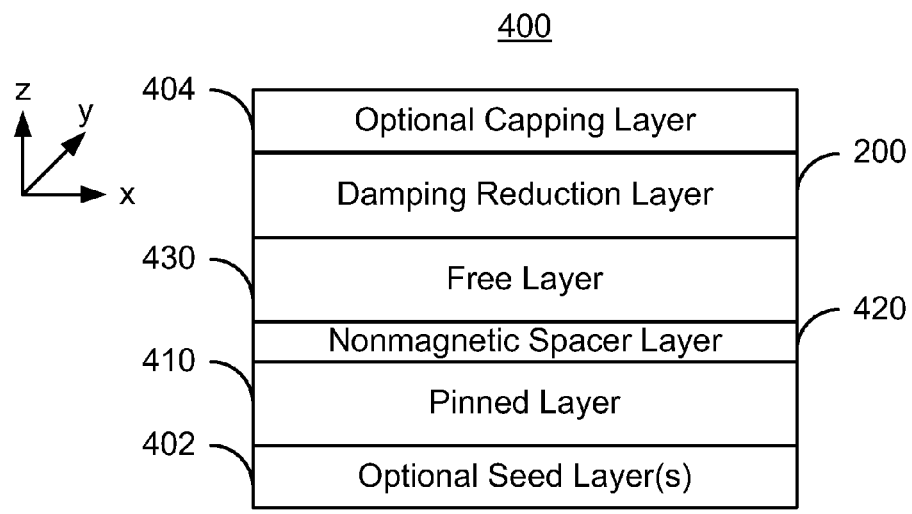
FIG. 11 depicts another exemplary embodiment of a magnetic junction including a damping reduction layer.

FIG. 11 depicts an exemplary embodiment of a magnetic junction 400 including a damping reduction layer such as the damping reduction layer 200. For clarity, FIG. 11 is not to scale. The magnetic junction 400 includes optional seed layer 402, a pinned layer 410, a nonmagnetic spacer layer 420, a free layer 430, and optional capping layer 404. Although layers 410, 420, and 430 are shown with a particular orientation, this orientation may vary in other embodiments. For example, the pinned layer 410 may be closer to the top (furthest from a substrate that is not shown) of the magnetic junction 400. An optional pinning layer (not shown) may adjoin the pinned layer 410 if, for example, the magnetic moment is in plane. The optional pinning layer may be used to fix the magnetization (not shown) of the pinned layer 410. In some embodiments, the optional pinning layer may be an AFM layer or multilayer that pins the magnetization (not shown) of the pinned layer 410 by an exchange-bias interaction. The magnetic junction 400 is also configured to allow the free layer 430 to be switched between stable magnetic states when a write current is passed through the magnetic junction 400. Thus, the free layer 430 is switchable utilizing spin transfer torque.

Although depicted as simple layers, the pinned layer 410 and/or the free layer 430 may include multiple layers. For example, the pinned layer 410 and/or the free layer 430 may be a SAF including magnetic layers antiferromagnetically or ferromagnetically coupled through thin layers, such as Ru. In such a SAF, multiple magnetic layers interleaved with thin layer(s) of Ru or other material may be used. The pinned layer 410 may also be another multilayer. Although a magnetization is not depicted in FIG. 11, the pinned layer 410 and/or the free layer 430 may have a perpendicular anisotropy energy that exceeds the out-of-plane demagnetization energy. Thus, the pinned layer 410 and/or the free layer 430 may have its magnetic moment oriented perpendicular to plane. In other embodiments, the magnetic moment of the pinned layer 410 and/or the free layer 430 is in-plane. Other orientations of the magnetization of the pinned layer 410 and/or the free layer 430 are possible. In some embodiments, the pinned layer 410 and/or the free layer 430 may include the magnetic substructure 100, 100', 100", and/or 100'''. Also in the embodiment shown, the pinned layer 410 is closer to the seed layer 402 than the free layer 430.

The spacer layer 420 is nonmagnetic. In some embodiments, the spacer layer 420 is an insulator, for example a tunneling barrier. In such embodiments, the spacer layer 420 may include crystalline MgO, which may enhance the TMR of the magnetic junction. The seed layer 402 and/or capping layer 404 may also include an insulator such as MgO. Such material(s) may be used in order to enhance the TMR if crystalline MgO is used in for the nonmagnetic spacer layer 420. In other embodiments, the spacer layer 420 may be a conductor, such as Cu. In alternate embodiments, the spacer layer 420 might have another structure, for example a granular layer including conductive channels in an insulating matrix.

The damping reduction layer 200 adjoins the free layer 430 in the embodiment shown in FIG. 11. Stated differently, the damping reduction layer 200 and the free layer 430 share an interface. The free layer 430 also resides between the damping reduction layer 200 and the nonmagnetic spacer layer 420. The damping reduction layer 200 reduces the damping coefficient, $\alpha$, of the free layer 430 below its intrinsic value. Thus, the damping of the free layer 430 is reduced. As a result, the free layer 430 may be written using spin transfer torque at a lower switching current density. Further, use of the magnetic substructure 100, 100', 100", and/or 100''' may further improve performance of the magnetic junction 400. Consequently, performance of the magnetic junction 400 may be enhanced.

Figure 12:
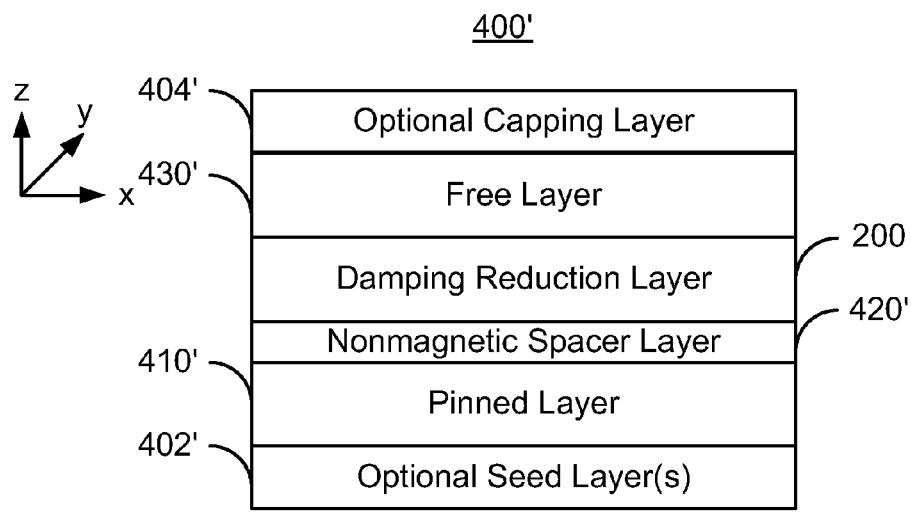
FIG. 12 depicts another exemplary embodiment of a magnetic junction including a damping reduction layer.

FIG. 12 depicts an exemplary embodiment of a magnetic junction 400' including magnetic substructure. For clarity, FIG. 12 is not to scale. The magnetic junction 400' is analogous to the magnetic junction 400. Thus, analogous layers are labeled similarly. The magnetic junction 400' includes a pinned layer 410', a nonmagnetic spacer layer 420', and a free layer 430' analogous to the layers 410, 420, and 430, respectively. Although layers 410', 420', and 430' are shown with a particular orientation, this orientation may vary in other embodiments. For example, the pinned layer 410' may be closer to the top (furthest from a substrate that is not shown) of the magnetic junction 400'. Also shown are optional seed layer 402' and optional capping layer 404' analogous to the optional seed layer 402 and optional capping layer 404. An optional pinning layer (not shown) might also be used. The magnetic junction 400' is also configured to allow the free layer 430' to be switched between stable magnetic states when a write current is passed through the magnetic junction 400'. Thus, the free layer 430' is switchable utilizing spin transfer torque. In addition, the pinned layer 410' is closer to the seed layer 402' than the free layer 430'.

The spacer layer 420' is nonmagnetic. In some embodiments, the spacer layer 420' is an insulator, for example a tunneling barrier. In such embodiments, the spacer layer 420' may include crystalline MgO, which may enhance the TMR of the magnetic junction. In other embodiments, the spacer layer may be a conductor, such as Cu. In alternate embodiments, the spacer layer 420' might have another structure, for example a granular layer including conductive channels in an insulating matrix.

The pinned layer 410' and/or the free layer 430' may be a simple layer or may include multiple layers. For example, the pinned layer 410' and/or the free layer 430' may be a SAF including magnetic layers antiferromagnetically or ferromagnetically coupled through thin layers, such as Ru. In such a SAF, multiple magnetic layers interleaved with thin layer(s) of Ru or other material may be used. The pinned layer 410' and/or the free layer 430' may also be another multilayer. Although a magnetization is not depicted in FIG. 12, the pinned layer 410' and/or the free layer 430' may have a perpendicular anisotropy energy that exceeds the out-of-plane demagnetization energy.

The damping reduction layer 200 adjoins the free layer 430' in the embodiment shown in FIG. 9. Stated differently, the damping reduction layer 200 and the free layer 430' share an interface. However, in the embodiment shown in FIG. 12, the damping reduction layer 200 is between the free layer 430' and the nonmagnetic spacer layer 420'. The free layer 430' is also closer to the seed layer 402' than the pinned layer 410'. The damping reduction layer 200 reduces the damping coefficient, $\alpha$, of the free layer 330' below its intrinsic value. Thus, the damping of the free layer 430' is reduced. As a result, the free layer 430' may be written using spin transfer torque at a lower switching current density. Further, use of the magnetic substructure 100, 100', 100", and/or 100''' may further improve performance of the magnetic junction 400'. Consequently, performance of the magnetic junction 400' may be enhanced.

Figure 13:
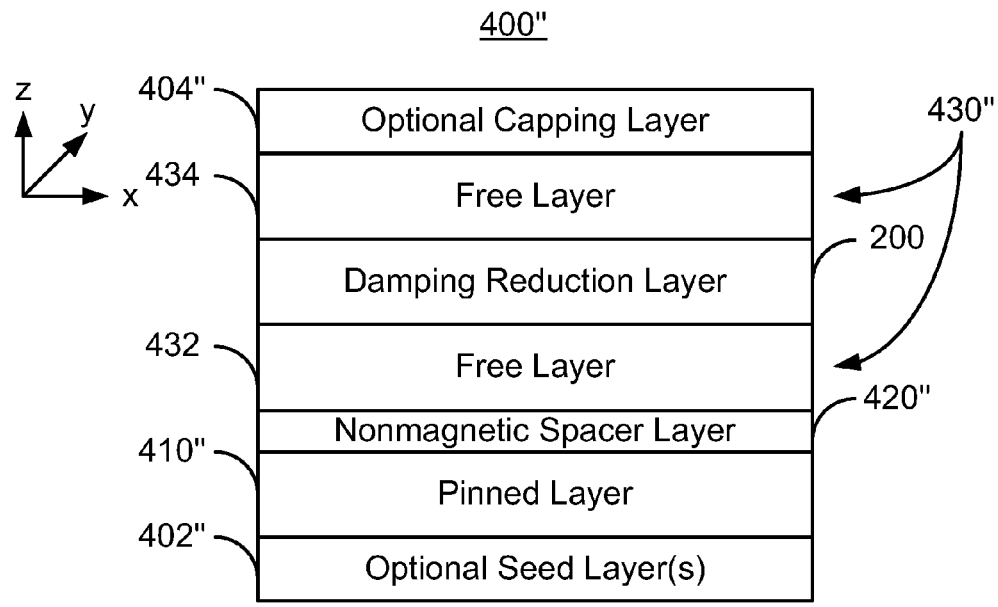
FIG. 13 depicts another exemplary embodiment of a magnetic junction including a damping reduction layer.

FIG. 13 depicts an exemplary embodiment of a magnetic junction 400" including magnetic substructure. For clarity, FIG. 13 is not to scale. The magnetic junction 400" is analogous to the magnetic junction 400 and/or 400'. Thus, analogous layers are labeled similarly. The magnetic junction 400" includes a pinned layer 410", a nonmagnetic spacer layer 420", and a free layer 430" analogous to the layers 410/410', 420/420', and 430/430', respectively. Although layers 410", 420", and 430" are shown with a particular orientation, this orientation may vary in other embodiments. For example, the pinned layer 410" may be closer to the top (furthest from a substrate that is not shown) of the magnetic junction 400". Also shown are optional seed layer 402" and optional capping layer 404" analogous to the optional seed layer 402/402' and optional capping layer 404/404'. An optional pinning layer (not shown) might also be used. The magnetic junction 400" is also configured to allow the free layer 430" to be switched between stable magnetic states when a write current is passed through the magnetic junction 400". Thus, the free layer 430" is switchable utilizing spin transfer torque.

The spacer layer 420" is nonmagnetic. In some embodiments, the spacer layer 420" is an insulator, for example a tunneling barrier. In such embodiments, the spacer layer 420" may include crystalline MgO, which may enhance the TMR of the magnetic junction. In other embodiments, the spacer layer may be a conductor, such as Cu. In alternate embodiments, the spacer layer 420" might have another structure, for example a granular layer including conductive channels in an insulating matrix.

The pinned layer 410" and/or the free layer 430" may be a simple layer or may include multiple layers. For example, the pinned layer 410" and/or the free layer 430" may be a SAF including magnetic layers antiferromagnetically or ferromagnetically coupled through thin layers, such as Ru. In such a SAF, multiple magnetic layers interleaved with thin layer(s) of Ru or other material may be used. The pinned layer 410" and/or the free layer 330" may also be another multilayer. Although a magnetization is not depicted in FIG. 13, the pinned layer 410" and/or the free layer 430" may have a perpendicular anisotropy energy that exceeds the out-of-plane demagnetization energy. The pinned layer 410" is also closer to the seed layer 402" than the free layer 430".

The damping reduction layer 200 not only adjoins portions of the free layer 430" in the embodiment shown in FIG. 13, but also lies within the free layer 430". Thus, the free layer 430" includes to sublayers 432 and 434 between which is the damping reduction layer 200. The damping reduction layer 200 reduces the damping coefficient, $\alpha$, of the free layer 430" below its intrinsic value. Thus, the damping of the free layer 430" is reduced. As a result, the free layer 430" may be written using spin transfer torque at a lower switching current density. Further, use of the magnetic substructure 100, 100', 100", and/or 100'" may further improve performance of the magnetic junction 400". Consequently, performance of the magnetic junction 400" may be enhanced.

Figure 14:
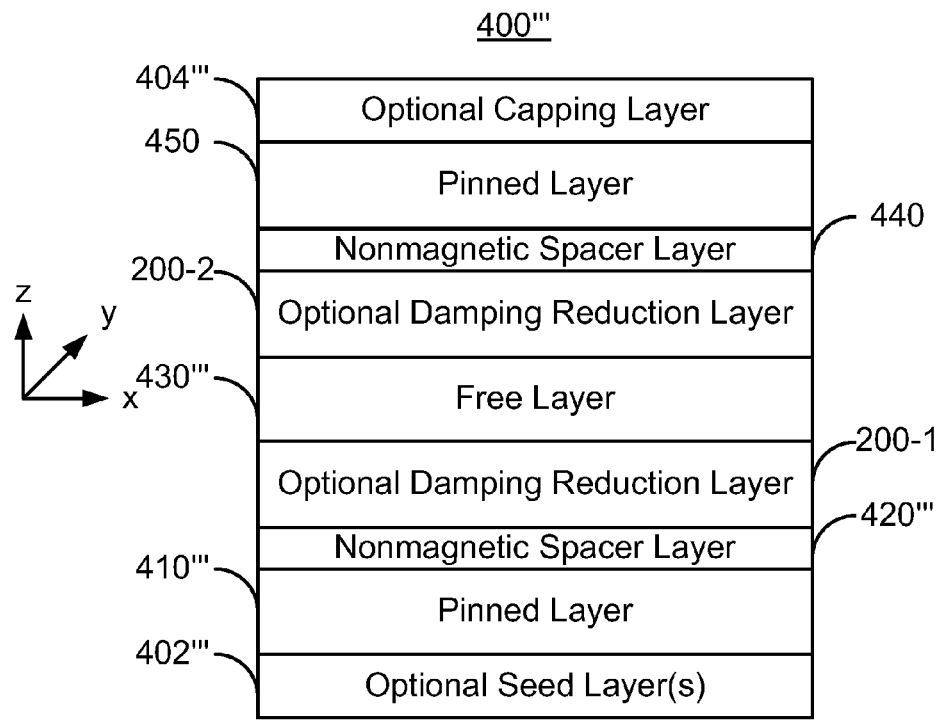
FIG. 14 depicts another exemplary embodiment of a magnetic junction including a damping reduction layer.

FIG. 14 depicts an exemplary embodiment of a magnetic junction 400'" including magnetic substructure. For clarity, FIG. 14 is not to scale. The magnetic junction 400'" is analogous to the magnetic junction 400, 400', and/or 400". Thus, analogous layers are labeled similarly. The magnetic junction 400'" includes a pinned layer 410'", a nonmagnetic spacer layer 420'", and a free layer 430'" analogous to the layers 410/410'/410", 420/420'/420", and 430/430'/430", respectively. Although layers 410'", 420'", and 430'" are shown with a particular orientation, this orientation may vary in other embodiments. For example, the pinned layer 410'" may be closer to the top (furthest from a substrate that is not shown) of the magnetic junction 400'". Also shown are optional seed layer 402'" and optional capping layer 404'" analogous to the optional seed layer 402/402'/402" and optional capping layer 404/404'/404". An optional pinning layer (not shown) might also be used. The magnetic junction 400'" is also configured to allow the free layer 430'" to be switched between stable magnetic states when a write current is passed through the magnetic junction 400'". Thus, the free layer 430'" is switchable utilizing spin transfer torque.

In the embodiment shown, the magnetic junction 400'" also includes an additional nonmagnetic spacer layer 440 and an additional pinned layer 450. Thus, the magnetic junction 400'" is a dual magnetic junction. Thus, in some embodiments, the nonmagnetic spacer layer 440 is the same as the nonmagnetic spacer layer 420'". However, in other embodiments, the nonmagnetic spacer layers 420'" and 440 are different. Similarly, in some embodiments, the pinned layer 450 is the same as the pinned layer 410'". However, in other embodiments, the pinned layers 410'" and 450 differ.

The spacer layers 420'" and/or 440 are nonmagnetic. In some embodiments, the spacer layer 420'" and/or 440 insulators, for example tunneling barriers. In such embodiments, the spacer layer 420'" and/or 440 may include crystalline MgO, which may enhance the TMR of the magnetic junction. In other embodiments, the spacer layer 420'" and/or 440 may be a conductor, such as Cu. In alternate embodiments, the spacer layer 420'" and/or 440 might have another structure, for example a granular layer including conductive channels in an insulating matrix.

The pinned layer 410'", the pinned layer 450, and/or the free layer 430'" may be a simple layer or may include multiple layers. For example, the pinned layer 410'", the pinned layer 450, and/or the free layer 430'" may be a SAF including magnetic layers antiferromagnetically or ferromagnetically coupled through thin layers, such as Ru. In such a SAF, multiple magnetic layers interleaved with thin layer(s) of Ru or other material may be used. The pinned layer 410'", the pinned layer 450, and/or the free layer 430'" may also be another multilayer. Although a magnetization is not depicted in FIG. 14, the pinned layer pinned layer 410'", the pinned layer 450, and/or the free layer 430'" may have a perpendicular anisotropy energy that exceeds the out-of-plane demagnetization energy.

Two damping reduction layers 200-1 and 200-2 are shown in FIG. 14. However, in other embodiments, only one damping reduction layer 200-1 or 200-2 is used. Each of the damping reduction layers 200-1 and 200-2 is analogous to the damping reduction layer 200. In the embodiment shown in FIG. 14, the damping reduction layers 200-1 and 200-2 sandwich the free layer 430'". Thus, each damping reduction layer 200-1 and 200-2 shares an interface with the free layer 430'". The damping reduction layers 200-1 and 200-2 reduce the damping coefficient, $\alpha$, of the free layer 430'" below its intrinsic value. Thus, the damping of the free layer 430'" is reduced. As a result, the free layer 430'" may be written using spin transfer torque at a lower switching current density. Further, use of the magnetic substructure 100, 100', 100", and/or 100'" may further improve performance of the magnetic junction 400'". Consequently, performance of the magnetic junction 400'" may be enhanced.

Figure 15:
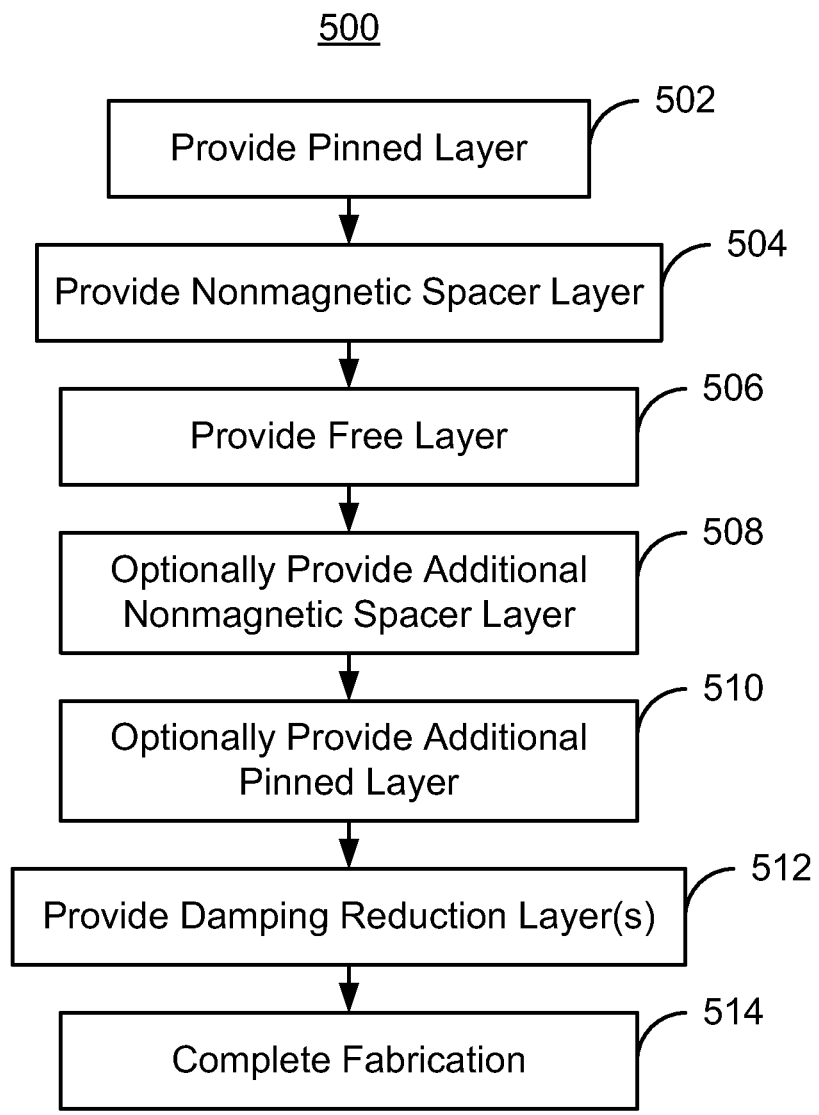
FIG. 15 an exemplary embodiment of a method for fabricating a magnetic junction including a damping reduction layer.

FIG. 15 depicts an exemplary embodiment of a method 500 for fabricating magnetic substructure. For simplicity, some steps may be omitted, combined, interleaved, and/or performed in another order. The method 500 is described in the context of the magnetic junction 300. However, the method 500 may be used on other magnetic junctions such as the junctions 300', 300", 400, 400', 400" and/or 400'". Further, the method 500 may be incorporated into fabrication of magnetic memories. Thus the method 500 may be used in manufacturing a STT-RAM or other magnetic memory. The method 500 may commence after the seed layer(s) 302 and optional pinning layer (not shown) are provided.

The pinned layer 310 is provided, via step 502. Step 312 may include depositing the desired materials at the desired thickness of the pinned layer 310. Further, step 502 may include providing a SAF. In other embodiments, the magnetic substructure 100, 100', 100", and/or 100'" may be provided. The nonmagnetic layer 320 is provided, via step 504. Step 504 may include depositing the desired nonmagnetic materials, including but not limited to crystalline MgO. In addition, the desired thickness of material may be deposited in step 504.

The free layer 330 optionally including the magnetic substructure 100, 100', 100", and/or 100'" is provided, via step 506. An additional nonmagnetic spacer layer, such as layer 440'" may be provided, via step 508. An additional pinned layer, such as the layer 450'", may be optionally provided, via step 510. The damping reduction layer 200, 200-1, and/or 200-2 may be fabricated, via step 512. Because the damping reduction layer 200, 200-1, and/or 200-2 may adjoin the free layer 330, step 512 may be performed at another point in the method 500. For example, if the free layer 330 is closer to the substrate than the pinned layer 502, then step 512 may be performed both 506 and 502. Fabrication may then be completed, via step 514. For example, the capping layer 304 may be provided. In some embodiments, in which the layers of the magnetic junction are deposited as a stack, then defined, step 514 may include defining the magnetic junction 300, performing anneals, or otherwise completing fabrication of the magnetic junction 300. Further, if the magnetic junction 300 is incorporated into a memory, such as an STT-RAM, step 514 may include providing contacts, bias structures, and other portions of the memory. Consequently, the benefits of the magnetic junction 300 may be achieved.

Figure 16:
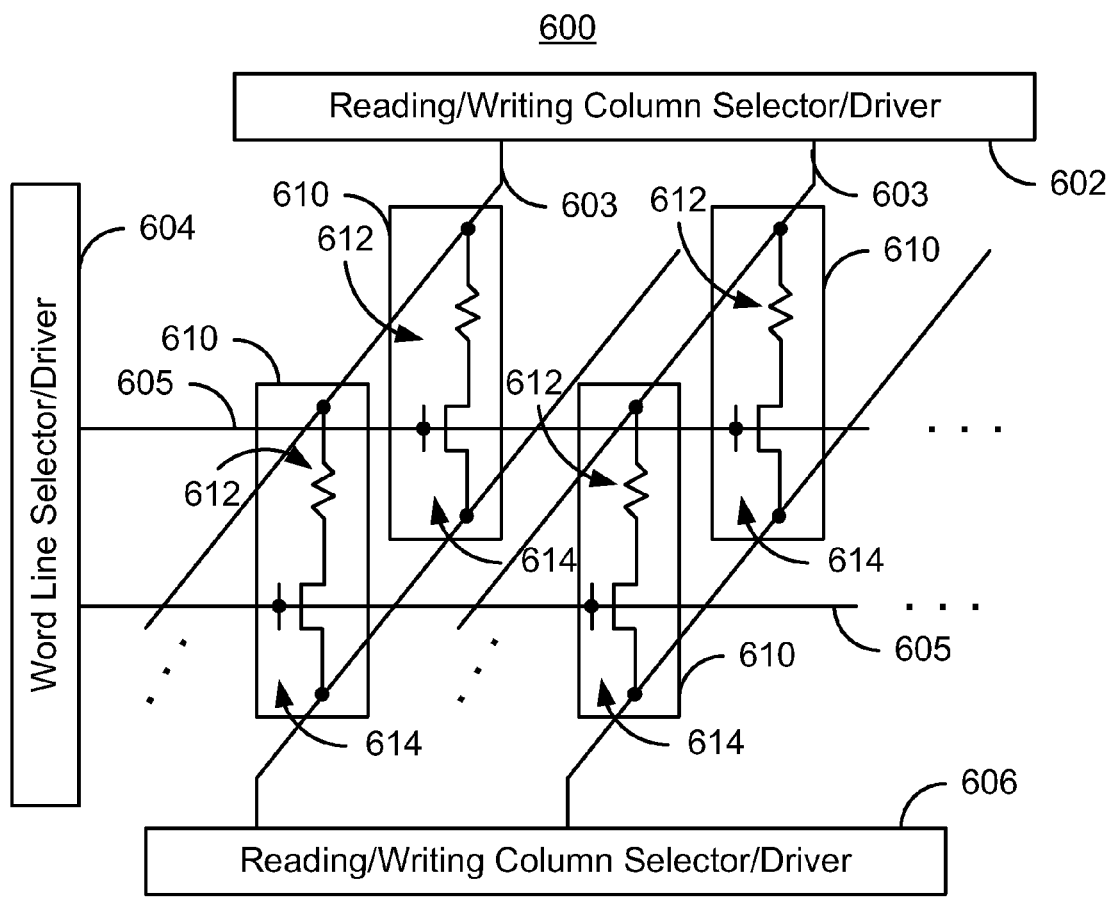
FIG. 16 depicts an exemplary embodiment of a memory utilizing magnetic junctions in the memory element(s) of the storage cell(s).

Further, the magnetic junctions 300, 300', 300", 400, 400', 400", and/or 400'" may be used in a magnetic memory. FIG. 16 depicts an exemplary embodiment of one such memory 600. The magnetic memory 600 includes reading/writing column select drivers 602 and 606 as well as word line select driver 604. Note that other and/or different components may be provided. The storage region of the memory 600 includes magnetic storage cells 610. Each magnetic storage cell includes at least one magnetic junction 612 and at least one selection device 614. In some embodiments, the selection device 614 is a transistor. The magnetic junctions 612 may be one of the magnetic junctions 300, 300', 300", 400, 400', 400", and/or 400'". Although one magnetic junction 612 is shown per cell 610, in other embodiments, another number of magnetic junctions 612 may be provided per cell. As such, the magnetic memory 600 may enjoy the benefits described above, such as lower soft error rate and a low critical switching current.

Various magnetic substructures 100, 100', 100", and 100'", damping layers, 200, as well as magnetic junctions 300, 300', 300", 400, 400', 400", and/or 400'" have been disclosed. Note that various features of the magnetic substructures 100, 100', 100", and 100'", damping layers, and the magnetic junctions 300, 300', 300", 400, 400', 400", and/or 400'" may be combined. Thus, one or more of the benefits of the magnetic substructures 100, 100', 100", and 100'", the damping layer 200, 200-1, and/or 200-2, and the magnetic junctions 300, 300', 300", 400, 400', 400", and/or 400'" such as reduced write error rate, a perpendicular anisotropy, thermal stability, scalability, and/or lower write current may be achieved.

A method and system for providing a magnetic substructure, a damping layer, a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction for use in a magnetic device comprising:
 a pinned layer;
 a nonmagnetic spacer layer;
 a free layer having an intrinsic damping constant, the nonmagnetic spacer layer residing between the pinned layer and the free layer; and
 at least one damping reduction layer adjacent to at least a portion of the free layer and configured to reduce damping for the free layer such that a damping constant of the free layer in the magnetic junction is less than the intrinsic damping constant of the free layer, the at least one damping reduction layer being between the at least the portion of the free layer and the nonmagnetic spacer layer;
 wherein the magnetic junction is configured such that the free layer is switchable between a plurality of stable magnetic states when a write current is passed through the magnetic junction, the plurality of stable states of the free layer corresponding to a plurality of orientations between a free layer magnetic moment and a pinned layer magnetic moment, the plurality of orientations corresponding to a plurality of magnetoresistances across the nonmagnetic spacer layer and between the free layer and the pinned layer.

2. The magnetic junction of claim 1 wherein the at least one damping reduction layer includes at least one oxide configured to allow conduction of current carriers through the at least one damping reduction layer.

3. The magnetic junction of claim 2 wherein the at least one damping reduction layer is at least one of a tunneling barrier layer, a discontinuous layer, and a composite layer including a plurality of conductive channels in an oxide matrix.

4. The magnetic junction of claim 3 wherein the at least one damping reduction layer includes at least one of tantalum oxide, magnesium oxide, iron oxide, cobalt oxide, cobalt-iron oxide, ruthenium oxide.

5. The magnetic junction of claim 2 wherein the at least one damping reduction layer is a single damping reduction layer adjoining the free layer, the free layer being between the damping reduction layer and the nonmagnetic spacer layer.

6. The magnetic junction of claim 2 wherein the at least one damping reduction layer is a single damping reduction layer adjoining the a first portion of the free layer, a second portion of the free layer being between the damping reduction layer and the nonmagnetic spacer layer.

7. The magnetic junction of claim 2 wherein the at least one damping reduction layer includes a first damping reduction layer and a second damping reduction layer, the free layer being between the first damping reduction layer and the second damping reduction layer.

8. A magnetic junction for use in a magnetic device comprising: a pinned layer;
 a nonmagnetic spacer layer;
 a free layer having an intrinsic damping constant, the nonmagnetic spacer layer residing between the pinned layer and the free layer;
 at least one damping reduction layer adjacent to at least a portion of the free layer and configured to reduce damping for the free layer such that a damping constant of the free layer in the magnetic junction is less than the intrinsic damping constant of the free layer, the at least one damping reduction layer including at least one oxide configured to allow conduction of current carriers through the at least one damping reduction layer;

a magnetic substructure included in at least one of the free layer and the pinned layer, the magnetic substructure including at least two magnetic layers interleaved with at least one insertion layer, each of the at least one insertion layer including at least one of Cr, Ta, Ti, W, Ru, V, Cu, Mg, aluminum oxide, and MgO, the at least two magnetic layers being exchange coupled, the magnetic substructure having a magnetic moment having a stable state at an angle from a direction perpendicular to a top surface of the magnetic substructure, the angle being greater than zero degrees and less than ninety degrees;

wherein the magnetic junction is configured such that the free layer is switchable between a plurality of stable magnetic states when a write current is passed through the magnetic junction, the plurality of stable states of the free layer corresponding to a plurality of orientations between a free layer magnetic moment and a pinned layer magnetic moment, the plurality orientations corresponding to nonmagnetic spacer layer and between the free layer and the pinned layer.

9. The magnetic junction of claim 2 wherein the free layer has a perpendicular magnetic anisotropy energy greater than an out-of-plane demagnetization energy.

10. The magnetic junction of claim 2 wherein the at least one damping reduction layer preserves spin information of at least a portion of the current carriers scattering in the at least one damping reduction layer.

11. The magnetic junction of claim 10 wherein the at least one damping reduction layer preserves the spin information of a majority of the current carriers scattering in the at least one damping reduction layer.

12. A magnetic memory comprising: a plurality of magnetic storage cells, each of the plurality of magnetic storage cells including at least one magnetic junction, the at least one magnetic junction including a pinned layer, a nonmagnetic spacer layer, a free layer having an intrinsic damping constant, the nonmagnetic spacer layer residing between the pinned layer and the free layer, and at least one damping reduction layer adjacent to at least a portion of the free layer and configured to reduce damping for the free layer such that a damping constant of the free layer in the magnetic junction is less than the intrinsic damping constant of the free layer, the at least one damping reduction layer being between the at least the portion of the free layer and the nonmagnetic spacer layer, the magnetic junction being configured such that the free layer is switchable between a plurality of stable magnetic states when a write current is passed through the magnetic junction; the plurality of stable states of the free layer corresponding to a plurality of orientations between a free layer magnetic moment and a pinned layer magnetic moment, the plurality of orientations corresponding to a plurality of magnetoresistances across the nonmagnetic spacer layer and between the free layer and the pinned layer; and a plurality of bit lines.

13. The magnetic memory of claim 12 wherein the at least one damping reduction layer includes at least one oxide configured to allow conduction of current carriers through the at least one damping reduction layer.

14. The magnetic memory of claim 12 wherein the at least one damping reduction layer is at least one of a tunneling barrier layer, a discontinuous layer, and a composite layer including a plurality of conductive channels in an oxide matrix.

15. The magnetic memory of claim 14 wherein the at least one damping reduction layer includes at least one of tantalum oxide, magnesium oxide, iron oxide, cobalt oxide, cobalt-iron oxide, ruthenium oxide.

16. The magnetic memory of claim 13 wherein the at least one damping reduction layer is a single damping reduction layer adjoining the free layer, the free layer being between the damping reduction layer and the nonmagnetic spacer layer.

17. The magnetic memory of claim 13 wherein the at least one damping reduction layer is a single damping reduction layer adjoining the a first portion of the free layer, a second portion of the free layer being between the damping reduction layer and the nonmagnetic spacer layer.

18. The magnetic memory of claim 13 wherein the at least one damping reduction layer includes a first damping reduction layer and a second damping reduction layer, the free layer being between the first damping reduction layer and the second damping reduction layer.

19. A magnetic memory comprising:
a plurality of magnetic storage cells, each of the plurality of magnetic storage cells including at least one magnetic junction, the at least one magnetic junction including a pinned layer, a nonmagnetic spacer layer, a free layer having an intrinsic damping constant, the nonmagnetic spacer layer residing between the pinned layer and the free layer, and at least one damping reduction layer adjacent to at least a portion of the free layer and configured to reduce damping for the free layer such that a damping constant of the free layer in the magnetic junction is less than the intrinsic damping constant of the free layer, the at least one damping reduction layer including at least one oxide configured to allow conduction of current carriers through the at least one damping reduction layer, the magnetic junction being configured such that the free layer is switchable between a plurality of stable magnetic states when a write current is passed through the magnetic junction, the plurality of stable states of the free layer corresponding to a plurality of orientations between a free layer magnetic moment and a pinned layer magnetic moment, the plurality of orientations corresponding to a plurality of magnetoresistances across the nonmagnetic spacer layer and between the free layer and the pinned layer;

at least one of the free layer and the pinned layer including a magnetic substructure, the magnetic substructure including at least two magnetic layers interleaved with at least one insertion layer, each of the at least one insertion layer including at least one of Cr, Ta, Ti, W, Ru, V, Cu, Mg, aluminum oxide, and MgO, the at least two magnetic layers being exchange coupled, the magnetic substructure having a magnetic moment having a stable state at an angle from a direction perpendicular to a top surface of the magnetic substructure, the angle being greater than zero degrees and less than ninety degrees; and a plurality of bit lines.

20. The magnetic memory of claim 13 wherein the free layer has a perpendicular magnetic anisotropy energy greater than an out-of-plane demagnetization energy.

21. The magnetic memory of claim 13 wherein the at least one damping reduction layer preserves spin information of at least a portion of the current carriers scattering in the at least one damping reduction layer.

22. The magnetic junction of claim 21 wherein the at least one damping reduction layer preserves the spin information of a majority of the current carriers scattering in the at least one damping reduction layer.

23. A method for providing a magnetic junction for use in a magnetic device comprising:
providing a free layer;
providing a nonmagnetic spacer layer;
providing a pinned layer having an intrinsic damping constant, the nonmagnetic spacer layer residing between the pinned layer and the free layer; and
providing at least one damping reduction layer adjacent to at least a portion of the free layer and configured to reduce damping for the free layer such that a damping constant of the free layer in the magnetic junction is less than the intrinsic damping constant of the free layer, the at least one damping reduction layer being between the at least the portion of the free layer and the nonmagnetic spacer layer;

wherein the magnetic junction is configured such that the free layer is switchable between a plurality of stable magnetic states when a write current is passed through the magnetic junction, the plurality of stable states of the free layer corresponding to a plurality of orientations between a free layer magnetic moment and a pinned layer magnetic moment, the plurality of orientations corresponding to a plurality of magnetoresistances across the nonmagnetic spacer layer and between the free layer and the pinned layer.

24. The method of claim 23 wherein the at least one damping reduction layer includes at least one oxide configured to allow conduction of current carriers through the at least one damping reduction layer.

25. The method of claim 24 wherein the step of providing the at least one damping reduction layer further includes:

naturally oxidizing the at least one of the free layer and the pinned layer.

26. The method of claim 24 wherein the at least one damping reduction layer is at least one of a tunneling barrier layer, a discontinuous layer, and a composite layer including a plurality of conductive channels in an oxide matrix.

27. The method of claim 26 wherein the at least one damping reduction layer includes at least one of tantalum oxide, magnesium oxide, iron oxide, cobalt oxide, cobalt-iron oxide, ruthenium oxide.

28. The method of claim 24 wherein the at least one damping reduction layer is a single damping reduction layer adjoining the free layer, the free layer being between the damping reduction layer and the nonmagnetic spacer layer.

29. The method of claim 24 wherein the at least one damping reduction layer is a single damping reduction layer adjoining the a first portion of layer, a second portion of the free layer being between the damping reduction layer and the nonmagnetic spacer layer.

30. The method of claim 24 wherein the at least one damping reduction layer includes a first damping reduction layer and a second damping reduction layer, the free layer being between the first damping reduction layer and the second damping reduction layer.

31. The method of claim 24 wherein the free layer has a perpendicular magnetic anisotropy energy greater than a out-of-plane demagnetization energy.

32. The method of claim 24 wherein the at least one damping reduction layer preserves spin information of at least a portion of the current carriers scattering in the at least one damping reduction layer.

33. The method of claim 32 wherein the at least one damping reduction layer preserves the spin information of a majority of the current carriers scattering in the at least one damping reduction layer.

* * * * *